(12) United States Patent
Park

(10) Patent No.: US 9,319,044 B2
(45) Date of Patent: Apr. 19, 2016

(54) SWITCH SYSTEM AND METHOD FOR VEHICLE

(71) Applicant: Hyundai Motor Company, Seoul (KR)

(72) Inventor: Beom Chun Park, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 732 days.

(21) Appl. No.: 13/687,998

(22) Filed: Nov. 28, 2012

(65) Prior Publication Data

US 2014/0055193 A1 Feb. 27, 2014

(30) Foreign Application Priority Data

Aug. 22, 2012 (KR) .................. 10-2012-0091593

(51) Int. Cl.
| | | |
|---|---|---|
| *B60L 1/00* | (2006.01) | |
| *H03K 17/96* | (2006.01) | |
| *G02B 27/01* | (2006.01) | |

(52) U.S. Cl.
CPC .............. *H03K 17/962* (2013.01); *G02B 27/01* (2013.01); *H03K 17/96* (2013.01); *G02B 2027/014* (2013.01); *H03K 2217/96031* (2013.01)

(58) Field of Classification Search
CPC .................................. Y02T 10/7005
USPC ........................................ 307/9.1
See application file for complete search history.

(56) References Cited

U.S. PATENT DOCUMENTS

| | | | | |
|---|---|---|---|---|
| 7,688,221 B2* | 3/2010 | Watanabe | ................. | B60R 1/00 180/167 |
| 8,184,107 B2* | 5/2012 | Lee | ..................... | G02F 1/13338 345/173 |
| 8,831,828 B2* | 9/2014 | Kato | ...................... | G06F 17/00 701/36 |

FOREIGN PATENT DOCUMENTS

| | | |
|---|---|---|
| JP | 2007-106353 A | 4/2007 |
| JP | 2008-234007 A | 10/2008 |
| KR | 10-2004-0011150 | 2/2004 |
| KR | 10-2004-0011150 A | 2/2004 |
| KR | 10-2006-0120447 A | 11/2006 |
| KR | 10-2008-0107913 A | 12/2008 |

* cited by examiner

*Primary Examiner* — Stephen W Jackson
(74) *Attorney, Agent, or Firm* — Mintz Levin Cohn Ferris Glovsky and Popeo, P.C.; Peter F. Corless

(57) ABSTRACT

The present invention relates to a switch system for a vehicle. The switch system, facilitates a desired switch to be accurately and conveniently manipulated in a state where a driver views information of the switch displayed through an display device while remaining focused during the vehicle operation. The switch system includes a touch sensor installed on a surface of the vehicle switch, detecting a user touch, a controller for determining an input of the touch sensor, and a display device for receiving a signal of the controller and displaying information of the switch touched by the user.

8 Claims, 2 Drawing Sheets

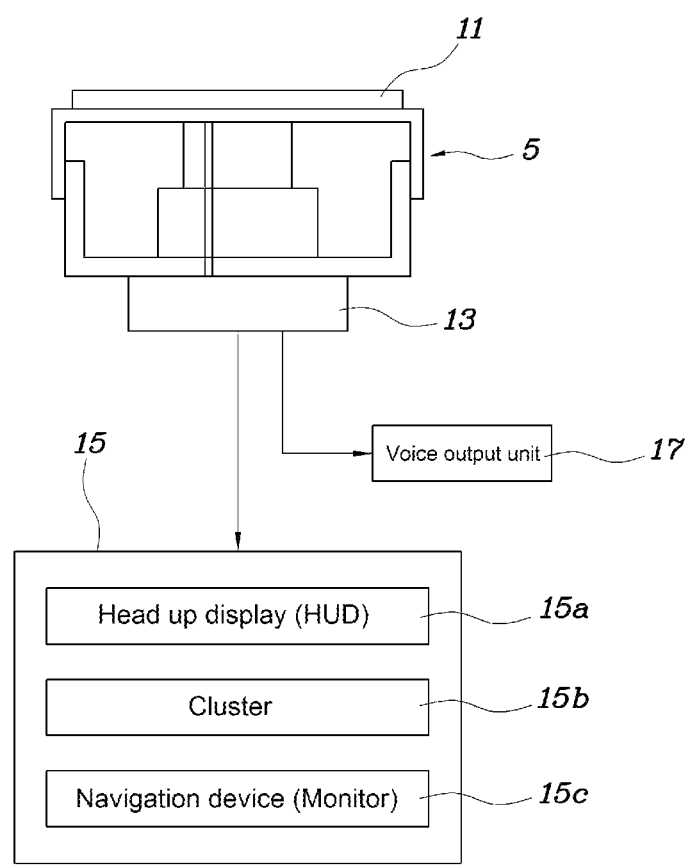

SWITCH SYSTEM AND METHOD FOR VEHICLE

CROSS-REFERENCE

This application claims under 35 U.S.C. §119(a) the benefit of Korean Application No. 10-2012-0091593 filed Aug. 22, 2012 the entire contents of which are incorporated herein by reference.

BACKGROUND

1. Field of the Invention

The present invention relates to a switch system for a vehicle, and more particularly, to a technology on a vehicle switch system by which information of a switch, touched by a user, is displayed through a display device, increasing driving safety.

2. Description of the Related Art

Conventionally, a user (e.g., a driver or a passenger) toggles a switch within a vehicle by physically manipulating the vehicle switch. The disadvantage to physically manipulating the vehicle switch itself is that the user must avert his or her attention from driving to toggle the switch.

Currently, vehicle switches may be found on different surfaces of the vehicle such as the steering wheel, a center panel, or the like. These current vehicle switches are manipulated by various methods such as a knob, a push button, or a rotary button. The switches are operated through manipulation of a user, and include an emergency switch, an air conditioning switch, and an audio switch.

As the number of convenience facilities for a vehicle user increases, many different types of switches are installed in a narrow area, and accordingly, a user visually checks a location of the switches to be manipulated before toggling the switches, to prevent an erroneous manipulation. During the vehicle travel, particularly during a high speed travel, when a user moves to toggle a switch, the possibility of an accident increases.

The foregoing is intended merely to aid in the understanding of the background of the present invention, and is not intended to mean that the present invention falls within the purview of the related art that is already known to those skilled in the art.

SUMMARY OF THE INVENTION

Accordingly, the present invention has been made in an effort to solve the above-described problems associated with prior art. An object of the present invention is to provide a switch system for a vehicle by which information of a switch, touched by a user, may be displayed through a display device installed in the vehicle. The information of the switch may be displayed before the switch is manipulated, so that a user may view a type and an operational function of the switch without visually checking the switch to be manipulated, improving convenience for a user and increasing driving safety.

In one aspect, the present invention provides a switch system for a vehicle, including a touch sensor installed on a surface of the vehicle switch to detect a user touch; a controller for determining an input of the touch sensor; and a display device for receiving a controller signal and displaying information of the switch touched by the user.

In an embodiment, the touch sensor includes a liquid crystal glass coated with a dielectric material, and is a capacitive touch sensor. Additionally, the displayed information of the switch includes a name (e.g., switch type) and an operational function of the switch. The display device may be a head-up display, a cluster, and a navigation device. Furthermore, the switch system may include a voice output unit for receiving a controller signal and outputting the information of the switch touched by the user through a voice.

BRIEF DESCRIPTION OF THE DRAWINGS

The above and other objects, features and advantages of the present invention will now be more clearly understood from the following detailed description taken in conjunction with the accompanying drawings in which:

FIG. 2 is an exemplary view illustrating a switch system for a vehicle including a capacitive touch sensor according to an exemplary embodiment of the present invention.

Figure 1:
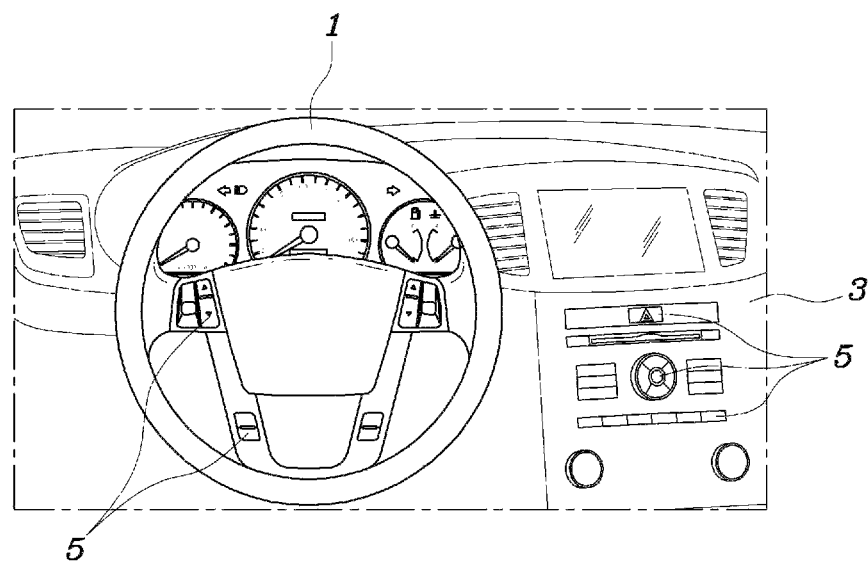
FIG. 1 is an exemplary view illustrating a plurality of switches installed in an interior of a vehicle according to an exemplary embodiment of the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DESCRIPTION OF PREFERRED EMBODIMENTS

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although the below exemplary embodiments are described as using a plurality of units to perform the above process, it is understood that the above processes may also be performed by a single controller or unit. Additionally, it is well understood that a single controller or a plurality of controllers may be utilized to execute each of the above described units. Accordingly, these units may be embodied as hardware or software which is executed by a controller.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Hereinafter, a switch system for a vehicle according to an exemplary embodiment of the present invention will be described with reference to the accompanying drawings.

A vehicle is equipped with various types of electronic parts configured to be operated through manipulation of switches, eliminating the need to operate the electronic part itself. As illustrated in FIG. 1, a plurality of switches 5 are installed in substantially narrow areas of the vehicle, such as a steering wheel 1 or a center panel 3. Accordingly, a user (e.g., a driver or a passenger) visually checks whether a proper switch 5 is selected prior to manipulating the switch 5. However, the driver may be distracted from driving by looking at the switch itself, increasing a possibility of an accident. Thus, the present invention provides a technology of allowing a driver to easily recognize information of a switch 5 to be manipulated without the need to look at the switch 5 itself.

As illustrated in FIG. 2, the switch system for a vehicle, according to the present invention, includes a touch sensor 11 installed on a surface of a vehicle switch 5 which detects a user touch; a controller 13 determining an input of the touch sensor 11; and a display device 15 receiving a signal of the controller 13 and displaying information of the switch 5 touched by the user.

The touch sensor 11 may include a liquid crystal glass coated with a dielectric material, and may be a capacitive touch sensor. That is, the touch sensor 11 may be a capacitive touch sensor using static electricity present in the body of a user to detect proximity, position, or displacement of a user touch. If a user's finger contacts a portion of the liquid crystal glass, electrons flowing on the liquid crystal are pulled to the contact point and the touch sensor 11 detects the contact. The controller 13 then determines a user input of the touch sensor 11. The capacitive touch sensor 5 may be integrally installed on substantially the entire surface of the switch 5. Alternatively, the capacitive touch sensor may be installed on a portion of the surface of the switch 5, increasing accuracy of the touch recognition and decreasing production costs of the capacitive touch sensor.

The display device 15 may be a head-up display 15a, a cluster 15b, and a navigation device 15c and the information of the switch 5 displayed by the display device 15 includes a name and an operational function of the switch 5.

The present invention further includes a voice output unit 17 for receiving a signal of the controller 13 and outputting the information of the switch 5 touched by the user through a voice.

Hereinafter, an operation of the embodiment of the present invention will be described.

If the body (e.g. a hand) of a user contacts a surface of the switch 5, while electric power is supplied to electronic parts of the vehicle, the capacitive touch sensor 11 detects a user touch and the controller 13 determines a user input of the touch sensor Furthermore, when the controller 13 determines a user input, it sends a control signal to the display device. The display device 13 displays information of the switch 5 including a name (e.g., a switch type) and an operational function of the switch 5. Then, a vehicle user, that is, a driver, may conveniently recognize various information of the switch displayed through the display device 15 without directly looking at the switch 5. The driver then only needs to manipulate the desired switch 5 on the display device after recognizing the switch information.

As described above, in the embodiment of the present invention, a driver may easily recognize information of a switch 5 to be manipulated by using information displayed on the display device 15 without directly looking at the switch 5. Thus, the vehicle driver may properly manipulate the switch 5 without taking his or her eyes from the road, increasing the driving safety and user convenience.

Meanwhile, the embodiment of the present invention further includes the voice output unit 17, relaying to the user the information of the switch 5 touched by the user through a voice. The voice output unit 17 is operated by a control signal of the controller 13, and the voice, which may be a speaker, outputs information of the corresponding switch 5 stored in a memory.

According to the switch system for a vehicle of the present invention, a desired switch may be accurately and conveniently manipulated when a driver views information of the switch displayed through a display device while remaining focused during the vehicle operation, increasing driving safety.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A switch system for a vehicle, comprising:
   a touch sensor, disposed on a surface of a vehicle switch, configured to detect a user touch;
   a controller configured to determine an input of the touch sensor;
   a display device, wherein the display device includes:
      receiving a signal of the controller; and
      displaying information of the switch touched by the user; and
   a voice output unit configured to receive the signal of the controller,
   wherein the voice output it configured to output the information of the switch touched by the user through a voice.

2. The switch system of claim 1, wherein the touch sensor comprises:
   a liquid crystal glass including a dielectric material coating; and
   a capacitive touch sensor.

3. The switch system of claim 1, wherein the information of the switch displayed by the display device includes:
   a name of the switch; and
   an operational function of the switch.

4. The switch system of claim 1, wherein the display device may be selected from a group consisting of a head-up display, a cluster, and a navigation device.

5. A method for switch manipulation, comprising:
   detecting a user touch through a touch sensor disposed on a surface of a vehicle switch;
   determining, by a controller, an input of the touch sensor;
   receiving a signal of the controller at a display device;
   displaying, on the display device, information of the switch touched by the user;
   receiving, at a voice output unit, the signal of the controller; and
   outputting the information of the switch touched by the user through a voice.

6. The method of claim 5 further comprising displaying a name and an operational function of the switch on the display device.

7. A non-transitory computer readable medium containing program instructions executed by a process, the computer readable medium comprising:
- program instructions that instruct a touch sensor to detect a user touch wherein the touch sensor is disposed on a surface of a vehicle switch;
- program instructions that instruct a controller to determine an input of the touch sensor;
- program instructions that instruct a display device to receive a signal of the controller;
- program instructions that instruct the display device to display information of the switch touched by the user;
- program instructions that instruct a voice output unit to receive the signal of the controller; and
- program instructions that instruct the voice output unit to output the information of the switch touched by the user through a voice.

8. The non-transitory computer readable medium of claim 7, further comprising program instructions that instruct the display device to display a name and an operational function of the switch touched by the user.

\* \* \* \* \*